United States Patent [19]

Kirchoefer

[11] Patent Number: 4,814,837

[45] Date of Patent: Mar. 21, 1989

[54] QUANTUM WELL ELECTRON BARRIER DIODE

[75] Inventor: Steven W. Kirchoefer, Bowie, Md.

[73] Assignee: The United States of America as represented by the Secretary of the Navy, Washington, D.C.

[21] Appl. No.: 839,246

[22] Filed: Mar. 13, 1986

[51] Int. Cl.$^4$ .................. H01L 27/12; H01L 27/26; H01L 29/06; H01L 29/161

[52] U.S. Cl. .......................................... 357/4; 357/3; 357/56; 357/57; 357/16

[58] Field of Search .................. 357/4 SL, 3, 56, 57, 357/16

[56] References Cited

U.S. PATENT DOCUMENTS

| | | | |
|---|---|---|---|
| 3,626,257 | 12/1971 | Esaki et al. | 357/56 |
| 3,982,207 | 9/1976 | Dingle et al. | 357/52 |
| 4,098,921 | 7/1978 | Calviello | 357/16 |
| 4,201,999 | 5/1980 | Howard | 357/65 |
| 4,257,055 | 3/1981 | Hess | 357/4 |
| 4,316,201 | 2/1982 | Christou | 357/16 |
| 4,620,206 | 10/1986 | Ohta et al. | 357/4 |
| 4,645,707 | 2/1987 | Davies et al. | 357/4 |
| 4,675,074 | 6/1987 | Wada et al. | 357/56 |
| 4,683,484 | 7/1987 | Derkits, Jr. | 357/56 |

FOREIGN PATENT DOCUMENTS

| | | | |
|---|---|---|---|
| 0163878 | 9/1984 | Japan | 357/4 SL |
| 2107927 | 5/1983 | United Kingdom | 357/4 SL |

OTHER PUBLICATIONS

S. W. Kirchoefer, H. S. Newman, and J. Comas, "Asymmetric Quantum Electron Barrier Diode," Applied Physics Letters, 46(9) (May 1985).

Primary Examiner—Martin H. Edlow
Assistant Examiner—Robert P. Limanek
Attorney, Agent, or Firm—Thomas E. McDonnell; Edward F. Miles

[57] ABSTRACT

A quantum well electron barrier diode comprising a substrate, a first buffer layer on the substrate, a superlattice structure on the first buffer layer, a second buffer layer on the superlattice structure, a contacting layer on the second buffer layer and first and second ohmic contacts attached to the contacting layer and substrate respectively. The superlattice structure comprises a sequence of a plurality of high energy gap barrier layers interleaved with a plurality of low energy gap wells. The sequence is repeated until the desired thickness is reached. Current flows perpendicular to the layers.

4 Claims, 1 Drawing Sheet

QUANTUM WELL ELECTRON BARRIER DIODE

BACKGROUND OF THE INVENTION

The present invention relates to electron barrier diodes, and more particularly, to an asymmetric quantum well electron barrier diode Rectifying current-voltage (I-V) characteristics have been observed in many types of electron barrier devices such as planar doped barrier diodes and Schottky barrier diodes. Schottky barrier diodes were the first such devices and remain the most attractive type for high-frequency applications because of their nearly ideal conduction characteristics and relative ease of fabrication. Schottky diodes are used in microwave circuits as mixers where a local oscillator waveform is combined with an incoming signal to produce a difference frequency known as the intermediate frequency. Several attempts have been made to produce conduction-band electron barrier potential devices which are in effect Schottky-like potentials buried in a bulk semiconductor. These devices have been explored in the hope that improved device characteristics could be achieved by moving the electron blocking potential away from the metal-semiconductor interface. One such early device was the camel diode which under went experimental evolution to become known eventually as the planar doped barrier diode. It has also been demonstrated that graded alloy devices exhibit similar diode behavior.

SUMMARY OF THE INVENTION

It is therefore an object of the present invention to provide an electron barrier diode that utilizes quantum wells to produce rectifying characteristics.

It is a further object of the present invention to structure an electron barrier diode that operates at high frequencies and is relatively temperature insensitive.

It is yet a further object of the present invention to structure an electron barrier diode that exhibits switching in both the forward and reverse bias directions.

These and other objects are achieved by a quantum well electron barrier diode comprising a first buffer layer disposed on a substrate, a superlattice structure disposed on the first buffer layer, a second buffer layer disposed on the superlattice structure and a contacting layer disposed on the second buffer layer. A first ohmic contact is disposed on the contacting layer and a second ohmic contact is disposed on the bottom of the substrate. The superlattice structure comprises a sequence of well layers and barrier layers interleaved with one another. The sequence is repeated until the desired thickness is achieved. Each successive barrier has the same thickness. The well layers however can decrease in thickness thereby producing asymmetry. The placement of the contacts allows the current to flow perpendicular to the layers.

DETAILED DESCRIPTION OF THE PREFERRED EMBODIMENT

Figure 1:
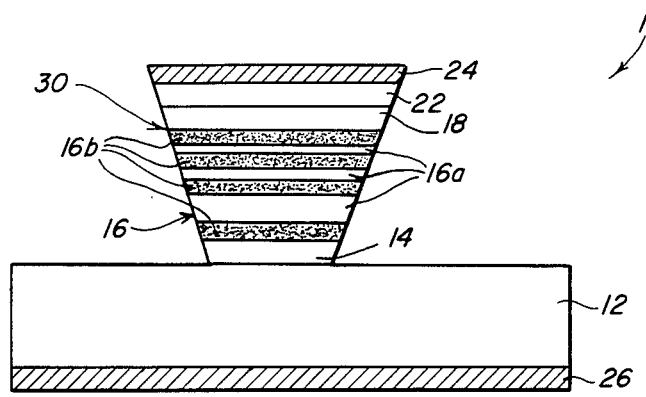
FIG. 1 is a schematic sectional view of the well electron barrier diode with the superlattice structure magnified for illustration according to the invention therein.

Turning now to FIG. 1, there is shown an illustrative embodiment of our invention, a quantum well barrier diode 10 fabricated by any epitaxial method, preferably by olecular beam epitaxy techniques (MBE). Diode 10 includes a substrate 12 made of n doped semiconductor material such as GaAs on which are grown the following in the order recited: a first buffer layer 14 generally of the same composition as the substrate 12; a superlattice structure 16; a buffer layer 18 generally of the same composition as substrate 12, and a contacting layer 22 generally of the same composition as substrate 12. Ohmic contacts 24 and 26 are formed on the top surface of contacting layer 22 and on the bottom surface of substrate 12, respectively.

Superlattice structure 16 comprises a sequence of a plurality of high energy gap barrier layers 16b made of AlGaAs for example interleaved with a plurality of low energy gap 16a made of GaAs for example. Each well layer 16a decreases in thickness from the preceding one. This sequence is repeated to the desired thickness. Generally, layers 16a and 16b are of the same conductivity type.

The buffer layers 14 and 18 are at least two screening lengths thick, generally between 0.5 micron and 1 micron to prevent interaction between superlattice structure 16 and the substrate 12 and the superlattice structure 16 and the contacting layer 22. The screening length, the length at which an electron can see charge, is dependent upon the doping concentration of buffer layers 14 and 18. The layers may be doped with any n type dopant such as silicon or germanium at a concentration between $1 \times 10^{15}$ cm$^{-3}$ and $1 \times 10^{18}$ cm$^{-3}$. At higher doping concentrations, the behavior of the device degrades due to the crossing of the conduction band edge by the Fermi level. At lower doping concentrations the screening length increases, and interaction between the superlattice structure 16 and substrate 12 or contacting layer 22 occurs.

Superlattice 16 is doped with n type impurity at the same concentration as the buffer layer 14 and is generally from 0.5 micron to 1 micron thick. The thickness of the wells ranges from 40 Å to 500 Å and the thickness of the barrier layers ranges from 40 Å to 80 Å. Contacting layer 22 is generally between 0.25 micron and 0.5 micron and is heavily doped with n type impurity so that a good ohmic contact is formed. Preferably, the doping concentration is approximately $5 \times 10^{18}$ cm$^{-3}$.

Growing the superlattice structure 16 entails first growing a hi e barrier layer 16b then a low energy well layer 16a of n doped GaAs on buffer layer 14 and then growing another high energy barrier layer 16b on the low energy well layer. The process is repeated until the desired number of well and barrier layers is attained. The entire sequence is repeated until the desired thickness is attained.

Generally the thickness of diode 10 is 4 mils to 5 mils. Metal lift of is used to deposit ohmic contact 24 on the top surface of the contacting layer 22. Diode 10 is then etched down to substrate 12 to form mesa 30 with ohmic contact 24 disposed thereon The bottom surface of substrate 12 is polished and Ohmic contact 26 is deposited. Contact 24 is approximately 1 mil to 4 mils in diameter and contact 26 is coextensive with the substrate.

The mechanism which governs conduction in quantum well electron barrier diodes is only qualitatively understood to date. Transport through the structure is believed to occur by means of electron scattering events between spatially isolated quantum states. It can be shown with simple wave mechanics that coupled quantum wells whose states do not lie in energy within a Kronig-Penny miniband width of each other exhibit little wavefunction overlap. This effect has been experimentally observed.

Figure 2:
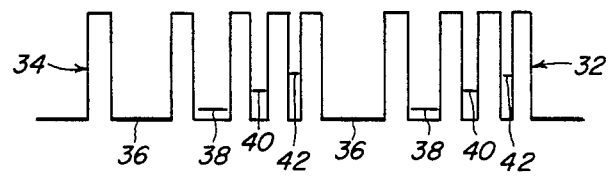
FIG. 2 is an energy band diagram of the asymmetric quantum well electron barrier diode.
Figure 3:
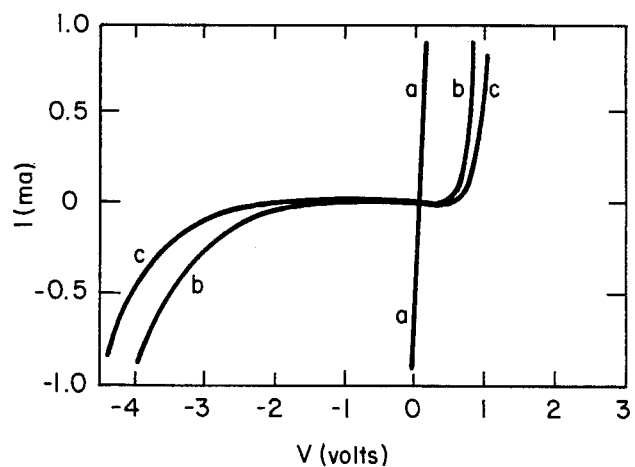
FIG. 3 is a graph of the I-V characteristics of the quantum well electron barrier diode.

The ground state energies for each well are shown in FIG. 2 and designated as 36, 38, 40 and 42. The ground state energy of each well corresponds to a multiple of a discrete energy step. The ground state energy, E, is related to the thickness, d, of the layer by the equation:

$$E = \frac{\pi^2 \hbar^2}{d^2 2m}$$

where $\hbar$ is Planck's constant and m is the effective mass of the electrons. Since these states are localized, electrons incident from the left side 34 have a set of potential steps composed of localized quantum states to overcome. These electrons can climb the barrier by scattering from one quantum state to the next. Electrons incident from the right side 32 have a much larger initial energy to overcome. An asymmetric I-V characteristic could thus be expected from such a structure due to the asymmetry of the quantum well potential. This is shown in FIG. 3 which contains the current versus voltage data obtained at 77° K. and 300° K. for the quantum well electron barrier diode. Forward bias is defined here as a positive potential on contact 24 relative to contact 26, which corresponds to electron flow ascending the barrier. Curve a is for an ohmic contact control device. Curves b and c are 300° K. and 77° K. data respectively showing that the diode 10 is relatively temperature insensitive. Similarly, one can either reverse the direction of the sequence of layers relative to substrate 12 or construct a symmetric potential, and thereby expect either a reverse asymmetric I-V or a symmetric I-V as a result. A limitation exists on the number of equal energy steps one can have before energy overlap with adjacent ground states of nearby wells might occur, due to thickness deviations on the order of a monolayer. Should this happen the I-V characteristic of the device may be degraded. The number of steps that can be produced without energy overlap is limited to between three and five discrete levels over the bulk band edge. This means that no more than three to five quantum wells can be used to define a sequence. This is true regardless of the magnitude of the energy step chosen.

Obviously, modifications and variations of the present invention, such as multiple terminal gated devices are possible in light of the above teachings. It is therefore to be understood that within the scope of the appended claims the invention may be practised otherwise than as specifically described.

What is claimed and desired to be secured by Letters Patent of the United States is:

1. A superlattice comprising one or more periodic semiconductor structures, each structure of said one or more periodic structures comprising:
   a plurality of low energy gap semiconductor layers;
   a plurality of high energy gap semiconductor layers interleaved with said plurality of low energy semiconductor layers;
   said interleaved layers being effective to create in said superlattice a plurality of potential energy wells along the length of said high and low energy gap layers;
   each well of said plurality of wells being of sequentially decreasing width along said length;
   wherein said superlattice is adapted to prevent any two of said pluraltiy of wells from having electron quantum energy states that lie within a Kronig-Penny miniband width of one another;
   wherein said superlattice is effective to rectify electric current across said low and high energy gap semiconductor layers.

2. The superlattice of claim 1, wherein the number of said plurality of potential energy wells is in the range between two and five.

3. The superlattice of claim 2, wherein said one or more periodic semiconductor structures is a plurality of said structures.

4. The superlattice of claim 1, wherein said one or more periodic semiconductor structures is a plurality of said structures.

* * * * *